United States Patent
Cheng et al.

(10) Patent No.: US 9,318,489 B2
(45) Date of Patent: Apr. 19, 2016

(54) COMPLEX CIRCUITS UTILIZING FIN STRUCTURES

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/805,529

(22) Filed: Jul. 22, 2015

(65) Prior Publication Data

US 2015/0340364 A1   Nov. 26, 2015

Related U.S. Application Data

(62) Division of application No. 14/282,050, filed on May 20, 2014, now Pat. No. 9,190,329.

(51) Int. Cl.
*H01L 27/088* (2006.01)
*H01L 21/02* (2006.01)
(Continued)

(52) U.S. Cl.
CPC ...... *H01L 27/0886* (2013.01); *H01L 21/02532* (2013.01); *H01L 21/02664* (2013.01); *H01L 21/823431* (2013.01); *H01L 29/16* (2013.01); *H01L 29/7849* (2013.01)

(58) Field of Classification Search
CPC . H01L 21/30; H01L 29/66795; H01L 29/785; H01L 29/7848

USPC ........... 257/347, 77, 190, 401, 369; 438/458, 438/283, 478
See application file for complete search history.

(56) References Cited

U.S. PATENT DOCUMENTS 7,067,430 B2   6/2006   Maa et al.
7,846,759 B2   12/2010  Atwater, Jr. et al.
(Continued)

OTHER PUBLICATIONS

Maeda et al. "Ultrathin layer transfer technology for post-Si semiconductors", Published in Sep. 2013, vol. 109 of Microelectronics Engineering. pp. 133-136.
(Continued)

*Primary Examiner* — Cuong Q Nguyen
*Assistant Examiner* — Tong-Ho Kim
(74) *Attorney, Agent, or Firm* — Michael J. DiCato; Bryan Bortnick

(57) ABSTRACT

A method of forming a semiconductor structure includes forming a multilayer lattice matched structure having an unstrained layer, a first strained layer, and a second strained layer formed between the unstrained and the first strained layer. A first opening in the multilayer structure is etched and a second strained fill material having a same material as the second strained layer is deposited. A second opening in the multilayer structure is etched and an unstrained fill material having a same material as the unstrained layer is deposited. A first strained fill material having a same material as the first strained layer is then deposited between the unstrained fill and the second strained fill. A second strained fin is formed from the deposited second strained fill material, a first strained fin is formed from the deposited first strained fill material, and an unstrained fin is formed from the deposited unstrained fill material.

6 Claims, 10 Drawing Sheets

(51) Int. Cl.
*H01L 21/8234* (2006.01)
*H01L 29/16* (2006.01)
*H01L 29/78* (2006.01)

(56) References Cited

U.S. PATENT DOCUMENTS

| | | | |
|---|---|---|---|
| 7,935,612 B1 | 5/2011 | Bedell et al. | |
| 7,973,336 B2 * | 7/2011 | Savage | H01L 21/6835 |
| | | | 257/190 |
| 2004/0227187 A1 * | 11/2004 | Cheng | H01L 29/66795 |
| | | | 257/347 |
| 2005/0011629 A1 | 1/2005 | Weyer et al. | |
| 2009/0159972 A1 * | 6/2009 | Jakschik | H01L 21/84 |
| | | | 257/350 |
| 2014/0264595 A1 * | 9/2014 | Basker | H01L 29/66795 |
| | | | 257/347 |

OTHER PUBLICATIONS

Pending U.S. Appl. No. 14/282,050, filed May 20, 2014, "Complex Circuits Utilizing Fin Structures", pp. 1-28.

* cited by examiner

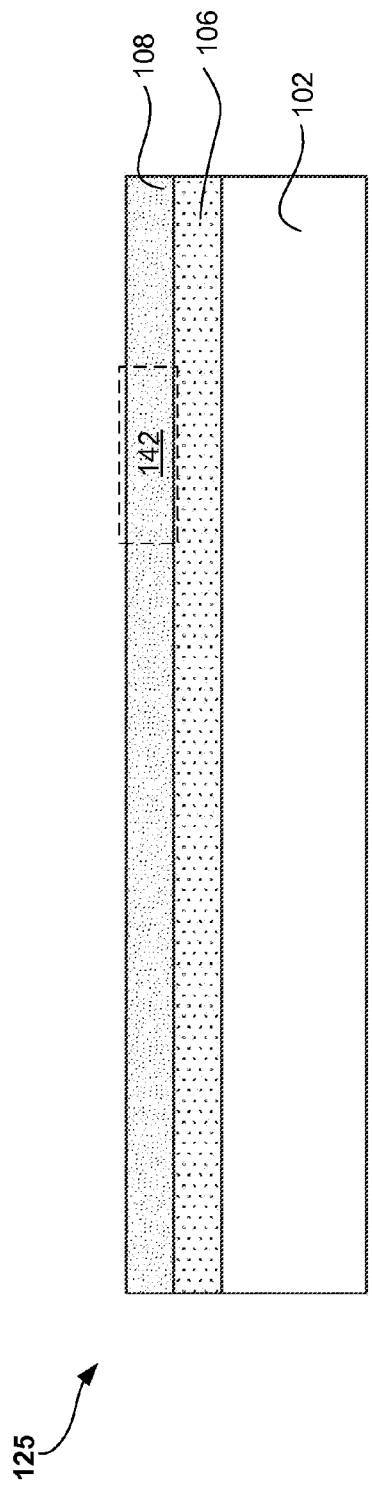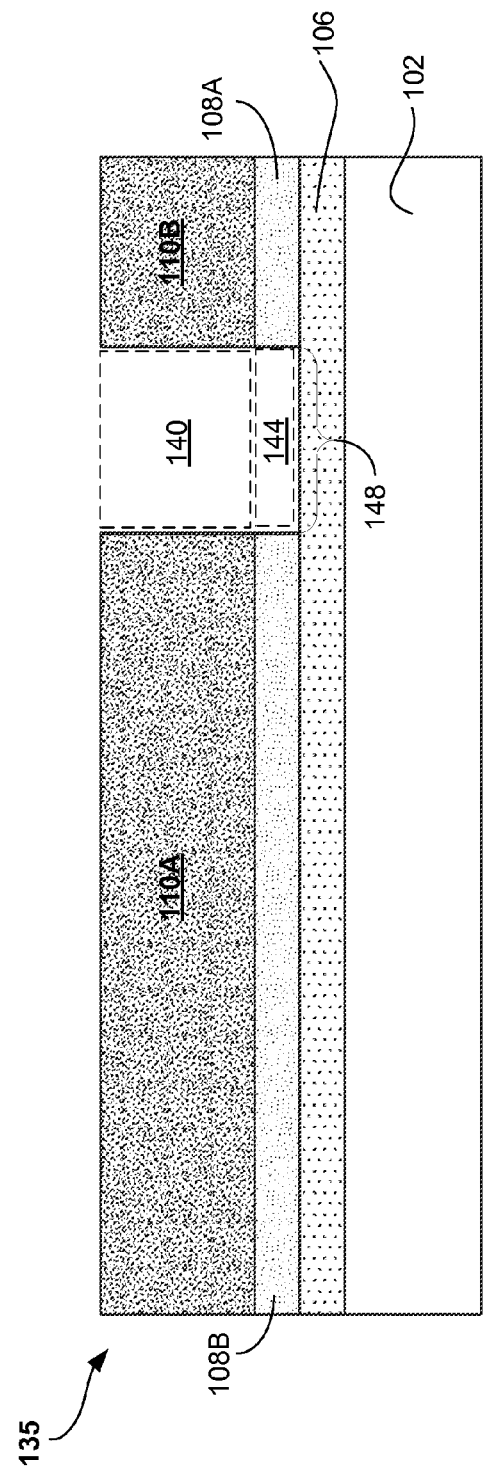

COMPLEX CIRCUITS UTILIZING FIN STRUCTURES

BACKGROUND

The present invention generally relates to semiconductor devices, and more particularly, to structures, fabrication methods, and design structures associated with fin-based devices.

A fin metal-oxide-semiconductor field effect transistor (finMOSFET, or finFET) may provide solutions to metal-oxide-semiconductor field effect transistor (MOSFET) scaling problems at and below, for example, the 22 nanometer (nm) node of semiconductor technology. A finFET includes at least one narrow semiconductor fin (preferably <30 nm wide) gated on at least two opposing sides of each of the at least one semiconductor fin. FinFET structures may, for example, typically be formed on either a semiconductor-on-insulator (SOI) substrate or a bulk semiconductor substrate.

A feature of a finFET is a gate electrode located on at least two sides of the channel formed along the longitudinal direction of the fin. Due to the advantageous feature of full depletion in the fin structure, the increased number of sides (e.g., two or three) on which the gate electrode controls the channel of the finFET enhances the controllability of the channel in a finFET compared to a planar MOSFET. The improved control of the channel, among other things, allows smaller device dimensions with less short channel effects as well as larger electrical current that can be switched at high speeds.

Based on, among other things, the characteristics mentioned above, the incorporation of finFET structures within integrated circuits beyond 22 nm nodes (i.e., <22 nm) is becoming more prevalent. While finFET structures provide improved scalability, CMOS technologies may, however, require fin structures capable of exhibiting different characteristics for incorporation within finFET structures that may be implemented in a variety of circuits.

SUMMARY

Therefore, according to at least one embodiment, a multilayer lattice matched structure is provided, whereby the top surface of a given layer of the multilayer lattice matched structure may be patterned and recessed to access other underlying layers of the multilayer lattice matched structure for fabricating a variety of strained/unstrained fin structures. Multiple cut masks may be used in the etching and epitaxial deposition of both strained and unstrained materials that may subsequently be used to form resulting strained/unstrained fin structures. The resulting fins structures may have different strain properties for incorporation within different circuits. For example, in some implementations one or more formed fins having a compressive strain may be used to create a p-type finFET device. Alternatively, one or more formed fins having a tensile strain may be used to create an n-type finFET device. Moreover, and one or more formed unstrained fins may be used to create finFET devices for analog circuit applications. The one or more formed unstrained fins may be used to create analog fin-based devices since these devices may tolerate less defects during fabrication and benefit more from less device variability. For the strained fins, the application of strain may introduce additional defects that may be offset against a desire for increased device performance (i.e., switching speeds, etc.). Thus, the one or more exemplary embodiments facilitate creating both strained and unstrained fins from epitaxially grown lattice matched multilayers.

BRIEF DESCRIPTION OF THE SEVERAL VIEWS OF THE DRAWINGS

FIG. 1C illustrates a cross-sectional view of a structure formed by bonding a second strained layer over the first bonded strained layer of FIG. 1B, according to one embodiment;

FIG. 1D illustrates a cross-sectional view of a structure formed by lithographically patterning and etching a portion of the bonded second strained layer of FIG. 1C, according to one embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following described and illustrated exemplary structures and processes include, among other things, a multilayer lattice matched structure, whereby the top surface of a given layer of the multilayer lattice matched structure may be patterned and recessed to access other underlying layers of the multilayer lattice matched structure for fabricating a variety of strained/unstrained fin structures. The resulting fins structures may have different strain properties for incorporation within different circuits. For example, one or more formed fins having a compressive strain may be used to create a p-type finFET device, one or more formed fins having a tensile strain may be used to create a n-type finFET device, and one or more formed unstrained fins may be used to create finFET devices for analog circuit applications. The one or more formed unstrained fins may be used to create analog fin-based devices since these devices may tolerate less defects during fabrication and benefit more from less variability. For the strained fins, the application of strain may introduce additional defects and/or additional device variability that may be offset against a desire for increased device performance (i.e., switching speeds, etc.). In contrast, however, certain device applications (i.e., analog devices) may require less variability in order to, for example, create matched devices having similar threshold voltages. Thus, the following described embodiments facilitate creating both strained and unstrained fins from epitaxially grown lattice matched multilayers.

FIGS. 1A-1L correspond to the fabrication of semiconductor structures that include fin structures having different characteristics for incorporation within a variety of finFET devices, or other fin-base devices, according to at least one exemplary embodiment.

Figures 1A, 1B:
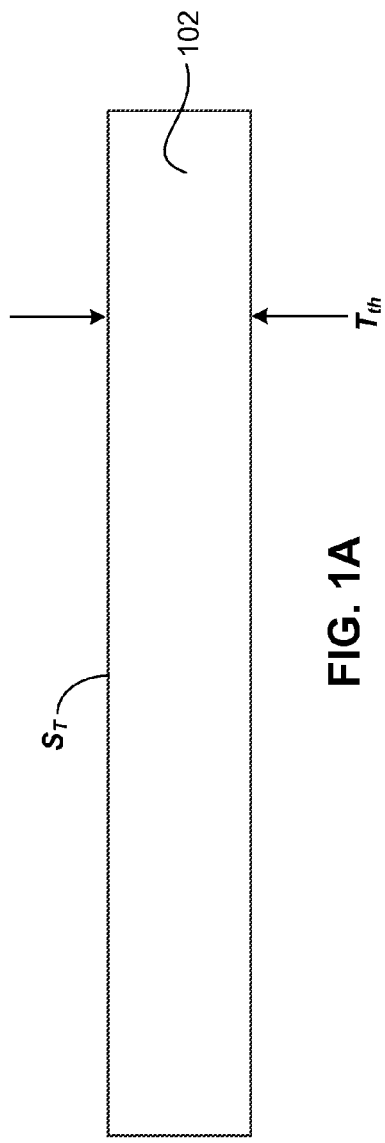
FIG. 1A illustrates a cross-sectional view of a structure having a semiconductor substrate used to form three-dimensional (3D) structures having different channel strain properties, according to one embodiment.
FIG. 1B illustrates a cross-sectional view of a structure formed by bonding a first strained layer over the semiconductor substrate of FIG. 1A, according to one embodiment.

Referring to FIG. 1A, a semiconductor structure 100 including a semiconductor substrate 102 is depicted. For example, semiconductor substrate 102 can be a bulk wafer formed of any conventional semiconductor substrate material including, but not limited to, silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and together summing to 1. Other suitable substrates may include II-VI compound semiconductors having a composition $Zn_{A1}Cd_{A2}Se_{B1}Te_{B2}$, where A1, A2, B1, and B2 are relative proportions each greater than or equal to zero and sum to 1. Other substrates used to form semiconductor structure 100 may, for example, include silicon-on-insulator (SOI) substrates or any substrate having a layer of unstrained silicon.

In the depicted embodiment of FIG. 1A, the substrate 102 may include an unstrained silicon material having a thickness $T_{th}$ in the range of about 500 micrometers (μm)-1.0 millimeter (mm). It may be appreciated, that although other types of material such as III-V material may be used, the substrate 102, in such a case, may include a top layer of epitaxially grown III-V material to be used as a base layer. As previously indicated, however, the substrate 102 associated with the described embodiment includes an unstrained silicon base layer.

As depicted in FIG. 1B, semiconductor structure 115 may include forming a first strained layer 106 over the top surface $S_T$ of the substrate 102 of FIG. 1A, according to an exemplary embodiment. The first strained layer 106 may include a germanium (Ge) layer having a thickness of about 5-20 nanometers (nm). Alternatively, for example, the first strained layer 106 may include a silicon-germanium (SiGe) layer also having a thickness of about 5-20 nanometers (nm). The SiGe layer forming strained layer 106 may include 50% silicon (Si) and 50% Germanium (Ge). The first strained layer 106 formed from Ge may exhibit a compressive strain (i.e., a compressive strain characteristic) of, for example, about 4%, which is a function of the Ge concentration. Alternatively, the first strained layer 106 formed from SiGe may exhibit a compressive strain of, for example, about 2%, based on the 50% Ge concentration. The first strained layer 106 may be formed on the substrate 102 using a layer-by-layer transfer process, as known in the art. Basically, the first strained layer 106 may include a Ge concentration (molar concentration) ranging from about 10% to 100%.

Generally, the Ge or SiGe first strained layer 106 may be deposited on another wafer (not shown). The other wafer including the deposited Ge or SiGe first strained layer 106 may then be thinned down using, a grinding, polishing, or etching process after being bonded to a first substrate such as substrate 102. The resulting structure is thus semiconductor structure 115. The layer-by-layer transfer method provides a higher level of crystallinity for the Ge or SiGe material used to form the first strained layer 106. Accordingly, the first strained layer 106 may exhibit an intended stress as opposed to a reduced stress caused by defects that may, for example, occur as a result of directly depositing the Ge or SiGe material used to form the first strained layer 106 on substrate 102.

As depicted in FIG. 1C, semiconductor structure 125 may include forming a second strained layer 108 over the first strained layer 106 of FIG. 1B, according to an exemplary embodiment. The second strained layer 108 may include a strained silicon (Si) layer having a thickness of about 5-20 nanometers (nm). The strained silicon layer forming strained layer 108 may exhibit a tensile strain (i.e., a tensile strain characteristic) of, for example, about 0.5%-4%, which may be caused by stretching the Si lattice. The second strained layer 108 may be formed on the first strained layer 106 using a layer-by-layer transfer process, as known in the art.

Generally, the Si second strained layer 108 may be deposited on another wafer (not shown). The other wafer including the deposited strained layer 108 may then be thinned down using, a grinding, polishing, or etching process after being bonded on the first strained layer 106. The resulting structure is thus semiconductor structure 125. As previously described, the layer-by-layer transfer method provides a higher level of crystallinity for the strained Si material used to form the second strained layer 108. Accordingly, the second strained layer 108 may exhibit an intended stress as opposed to a reduced stress caused by defects that may, for example, occur as a result of directly depositing strained Si material used to form the second strained layer 108 on the first strained layer 106. Thus, structure 125 includes a multilayer lattice matched structure formed from unstrained silicon substrate 102, Ge or SiGe strained layer 106, and strained silicon layer 108. In order to preserve strain in the strained layers (e.g., SiGe or Ge layer 106, strained Si layer 108, etc.), the lattice of the epitaxial layers 106, 108 may substantially match that of the substrate 102, otherwise, the epitaxial layers 106, 108 will relax, thus, causing a loss of strain. Furthermore, lattice mismatches may generate defects such as, for example, dislocation defects. Defects may accordingly increase device leakage current and degrade chip yield. Lattice matching may refer to lattice constants between two layers that are substantially the same.

Referring to FIG. 1D, semiconductor structure 135 may be created by forming a patterned hardmask 110A, 110B over structure 125 of FIG. 1C followed by an etch process, according to an exemplary embodiment. Particularly, the patterned silicon nitride hardmask 110A, 110B is a cut mask having exposed region 140. The silicon nitride hardmask 110A, 110B may have a thickness of about 20-50 nm. The patterned silicon nitride ($Si_3N_4$) hardmask 110A, 110B can be formed by lithographical patterning followed by a RIE (reactive ion etch) process. Alternatively, according to another exemplary implementation, the hardmask 110A, 110B may be formed from a silicon oxide material. Subsequently, an etch process such as reactive ion etching (RIE) may be used to remove strained region 142 (FIG. 1C) of the second strained layer 108 (FIG. 1C). Thus, opening 144 is formed in the second strained layer 108 to form second strained layer 108A and 108B.

Figure 1E:
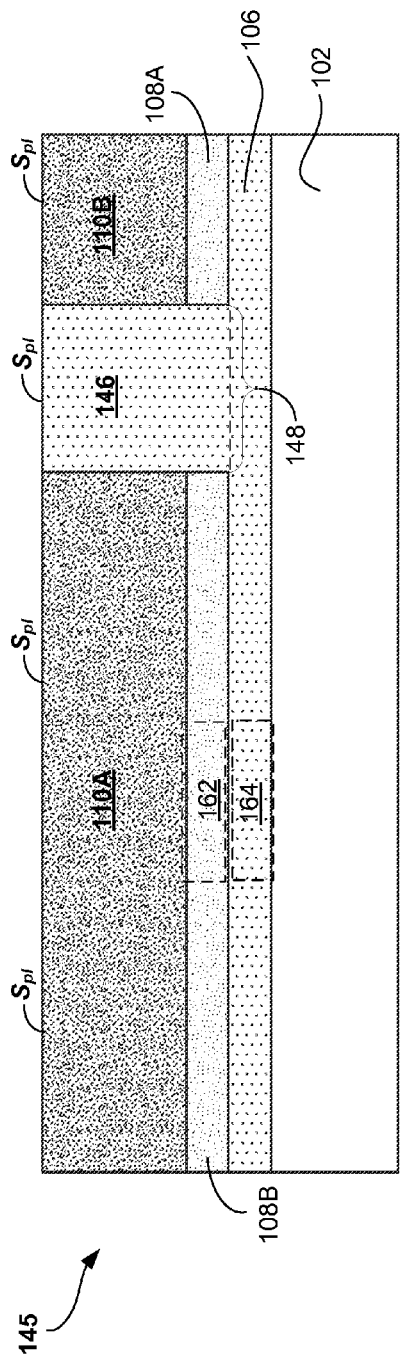
FIG. 1E illustrates a cross-sectional view of a structure formed by depositing silicon-germanium (SiGe) or germanium (Ge) fill material over the etched portion of the bonded second strained layer of FIG. 1D, according to one embodiment.

Referring to FIG. 1E, semiconductor structure 145 may be created by depositing a SiGe or Ge material 146 within exposed opening 140 (FIG. 1D) and opening 144 (FIG. 1D), according to an exemplary embodiment. Particularly, the SiGe or Ge material 146 is epitaxially grown using, for example, a CVD deposition process over a top surface portion 148 (FIG. 1D) of the first strained layer 106. If the underlying first strained layer 106 is formed from a Ge material, the deposited fill material 146 is also a Ge material. Alternatively, if the underlying first strained layer 106 is formed from a SiGe material, the deposited fill material 146 is accordingly a SiGe material. Once the SiGe or Ge material 146 is epitaxially grown within exposed opening 140 (FIG. 1D) and opening 144 (FIG. 1D), the SiGe or Ge material 146 may be planarized using, for example, chemical mechanical polishing (CMP), to form planarized surface $S_{pl}$. Since the SiGe or Ge fill material 146 is of the same material as the underlying layer, a certain amount of over-etching during the formation of opening 144 (FIG. 1D) may be permitted. It may be appreciated that the epitaxially grown material 146 may be deposited using various deposition techniques such as, but not limited to, chemical vapor deposition (CVD), plasma enhanced chemical vapor deposition (PECVD), sub-atomic chemical vapor deposition (SACVD), molecular beam epitaxy (MBE), etc. It may, however, also be appreciated that theses deposition techniques (i.e., CVD, SACVD, PECVD, etc.), or any other deposition processes conventionally utilized, may be applied for depositing the various other layers corresponding to the embodiments described herein.

Figure 1F:
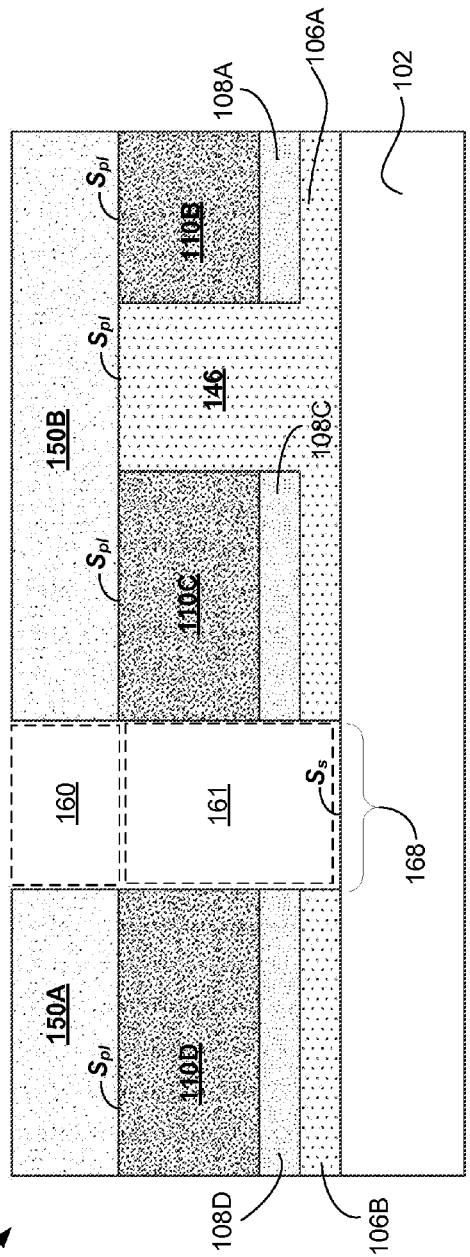
FIG. 1F illustrates a cross-sectional view of a structure formed by lithographically patterning and etching another portion of both the bonded first and second strained layer of FIG. 1E, according to one embodiment.

Referring to FIG. 1F, semiconductor structure 155 may be created by forming another lithographically patterned hardmask 150A, 150B over structure 145 of FIG. 1E followed by an etch process, according to an exemplary embodiment. Particularly, the lithographically patterned silicon nitride or silicon oxide hardmask 150A, 150B is another (second) cut mask having exposed region 160. The patterned hardmask 150A, 150B may be deposited over planarized surface $S_{pl}$ in order to expose region 160 and protect all remaining areas during a subsequent etch process. The silicon nitride ($Si_3N_4$) hardmask 150A, 150B may have a thickness of about 20-50 nm. An etch process such as reactive ion etching (RIE) may then be used to remove both strained region 162 (FIG. 1E) of the second strained layer 108B (FIG. 1E) and strained region 164 (FIG. 1E) of the first strained layer 106 (FIG. 1E). Thus, opening 161 is formed in hardmask region 110A (FIG. 1E), second strained layer 108B (FIG. 1E), and first strained layer 106 (FIG. 1E). Region 168 of top surface $S_s$ of the silicon substrate 102 is now exposed. Within second strained layer 108B (FIG. 1E), opening 161 accordingly divides layer 108B (FIG. 1E) into second strained layers 108C and 108D. Also, within first strained layer 106 (FIG. 1E), opening 161 accordingly divides layer 106 (FIG. 1E) into first strained layers 106A and 106B. Moreover, within hardmask region 110A (FIG. 1E), exposed region 160 accordingly divides hardmask region 110A (FIG. 1E) into hardmask regions 110C and 110D.

Figure 1G:
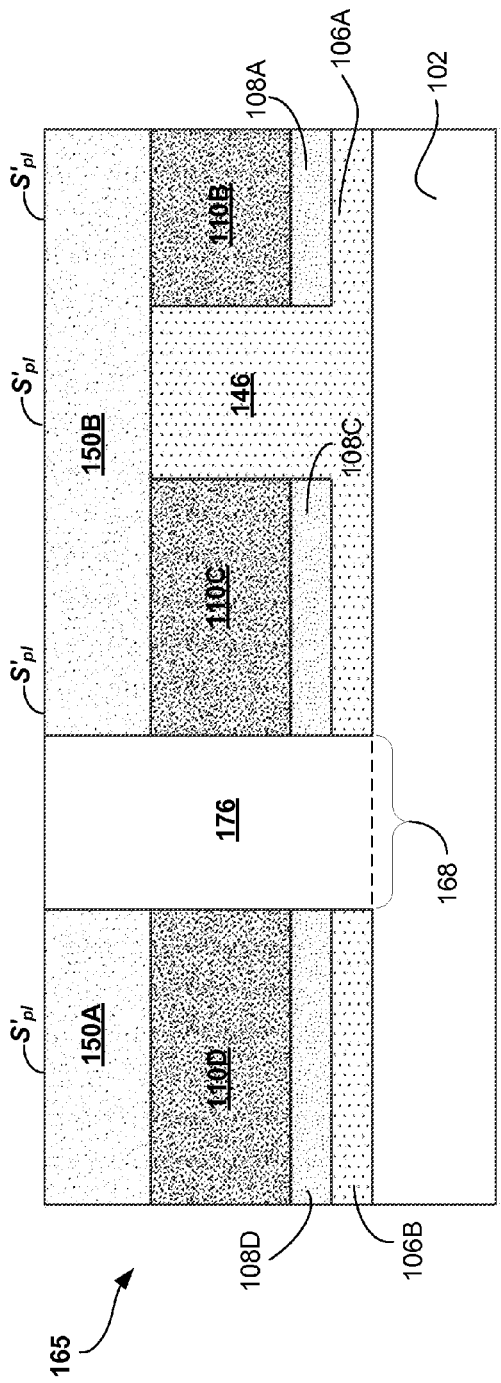
FIG. 1G illustrates a cross-sectional view of a structure formed by depositing an unstrained silicon (Si) material within the etched portion of FIG. 1F, according to an exemplary embodiment.

Referring to FIG. 1G, semiconductor structure 165 may be created by depositing an unstrained silicon (Si) material 176 within exposed opening 160 (FIG. 1F) and opening 161 (FIG. 1F), according to an exemplary embodiment. Particularly, the unstrained silicon (Si) material 176 is epitaxially grown using, for example, a CVD deposition process over the top surface $S_s$ of portion 168 (FIG. 1F) of the silicon substrate 102 (FIG. 1F). Once the unstrained Si material 176 is epitaxially grown within exposed opening 160 (FIG. 1F) and opening 161 (FIG. 1F), the unstrained Si material 176 may be planarized using, for example, chemical mechanical polishing (CMP), to form planarized surface $S'_{pl}$. Since the unstrained Si fill material 176 is of the same material as the underlying layer, a certain amount of over-etching during the formation of opening 161 (FIG. 1F) may be permitted. It may be appreciated that the epitaxially grown unstrained Si fill material 176 may be deposited using various deposition techniques such as, but not limited to, chemical vapor deposition (CVD), plasma enhanced chemical vapor deposition (PECVD), sub-atomic chemical vapor deposition (SACVD), etc. It may, however, also be appreciated that theses deposition techniques (i.e., CVD, SACVD, PECVD, etc.), or any other deposition processes conventionally utilized, may be applied for depositing the various other layers corresponding to the embodiments described herein.

Figure 1H:
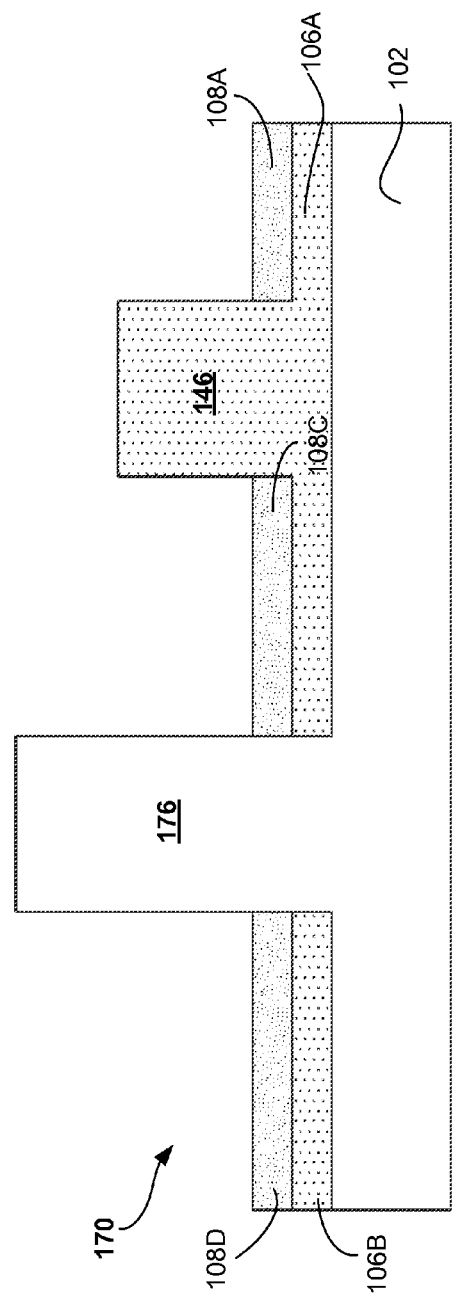
FIG. 1H illustrates a cross-sectional view of a structure formed by removing patterned hardmask regions from the structure of FIG. 1G, according to an exemplary embodiment.

Referring to FIG. 1H, semiconductor structure 170 may be created by removing hardmask regions 150A, 150B, 110B, 110C, and 110D (FIG. 1G) from structure 165 (FIG. 1G), according to an exemplary embodiment. For example, as depicted in FIG. 1H, a wet etch process selective to Si and SiGe may be utilized to accordingly remove hardmask regions 150A, 150B, 110B, 110C, and 110D (FIG. 1G) from structure 165 (FIG. 1G).

Figure 1I:
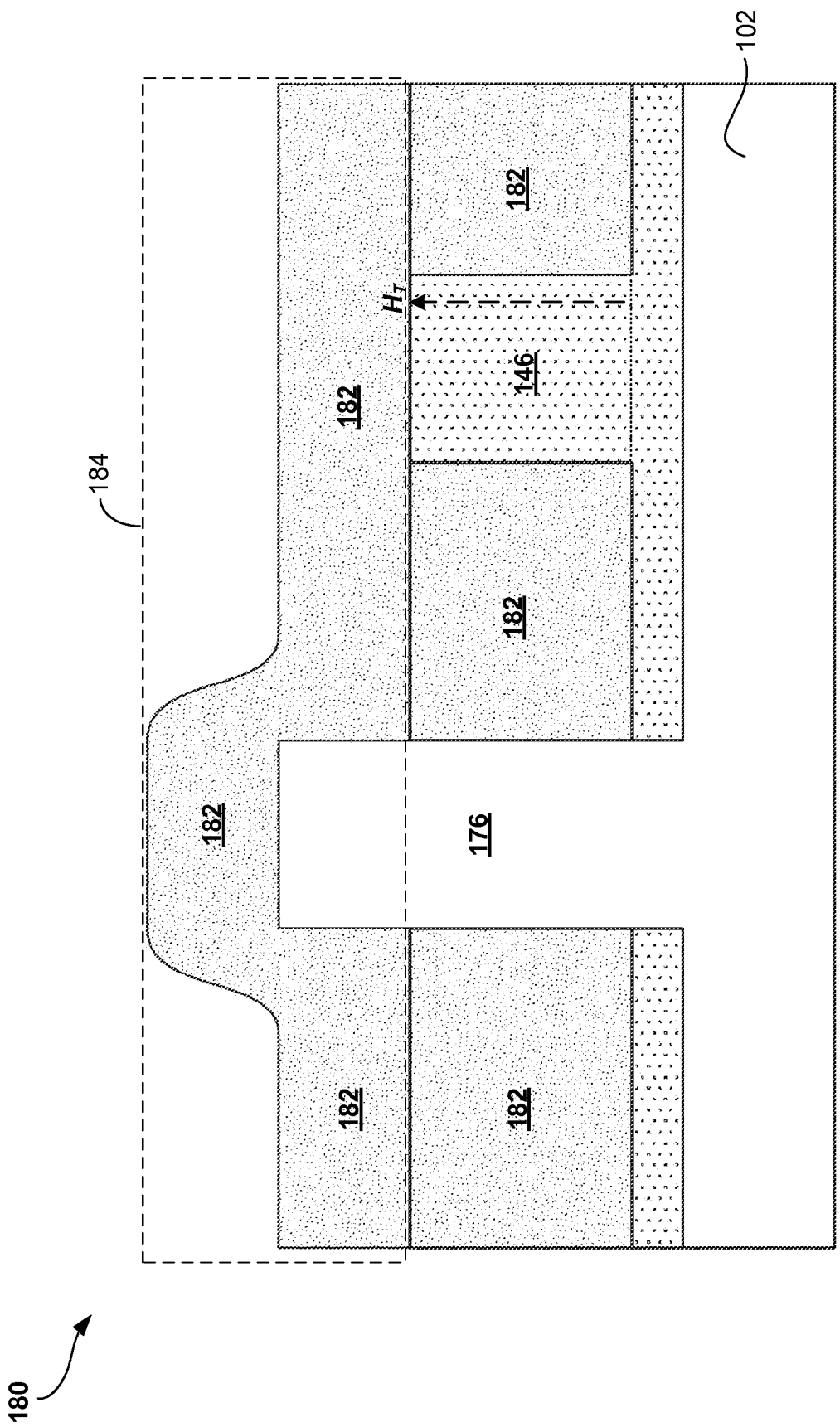
FIG. 1I illustrates a cross-sectional view of a structure formed by depositing another strained layer over the entire structure of FIG. 1H, according to an exemplary embodiment.

Referring to FIG. 1I, semiconductor structure 180 may be created by conformally depositing strained layer 182 over structure 170 of FIG. 1H, according to an exemplary embodiment. Particularly, the strained layer 182 is epitaxially grown using, for example, a CVD deposition process over the top surface of the structure 170 formed in FIG. 1H. The strained layer 182 may include a strained silicon (Si) layer having a thickness of about 100 nm-1 mm. The strained silicon layer forming strained layer 182 may exhibit a tensile strain of, for example, about 0.5%-4%, which may be caused by stretching the Si lattice. It may be appreciated that the epitaxially grown layer 182 may be deposited using various deposition techniques such as, but not limited to, chemical vapor deposition (CVD), plasma enhanced chemical vapor deposition (PECVD), sub-atomic chemical vapor deposition (SACVD), etc. It may, however, also be appreciated that theses deposition techniques (i.e., CVD, SACVD, PECVD, etc.), or any other deposition processes conventionally utilized, may be applied for depositing the various other layers corresponding to the embodiments described herein.

Figure 1J:
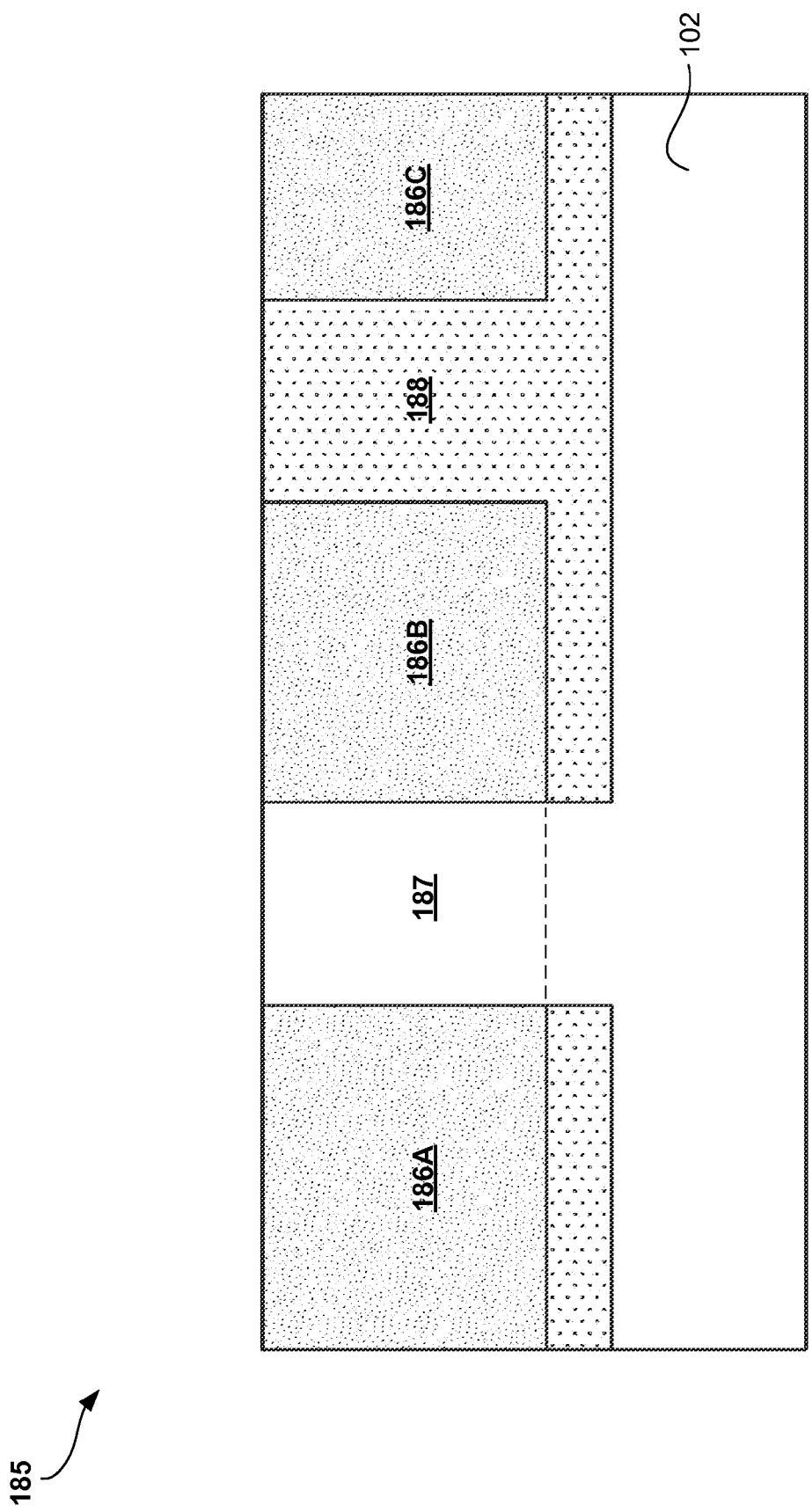
FIG. 1J illustrates a cross-sectional view of a structure formed by planarizing the structure of FIG. 1I, according to an exemplary embodiment.

Referring to FIG. 1J, semiconductor structure 185 may be created by planarizing structure 180 of FIG. 1I, according to one embodiment. In particular, portions of the silicon strained layer 182 (FIG. 1I) and unstrained Si fill material 176 (FIG. 1I) located within bounded region 184 (FIG. 1I) may be planarized down to the height $H_T$ (FIG. 1I) of the epitaxially grown material 146 (FIG. 1I) using, for example, a CMP process. As depicted in FIG. 1J, following the planarization, tensile strained silicon columns 186A-186C, compressive strained Ge (or SiGe) column 188, and unstrained silicon column 187 are formed. Each of the tensile strained silicon columns 186A-186C, compressive strained Ge (or SiGe) column 188, and unstrained silicon column 187 may subsequently be processed to form fins having different strain properties.

Figure 1K:
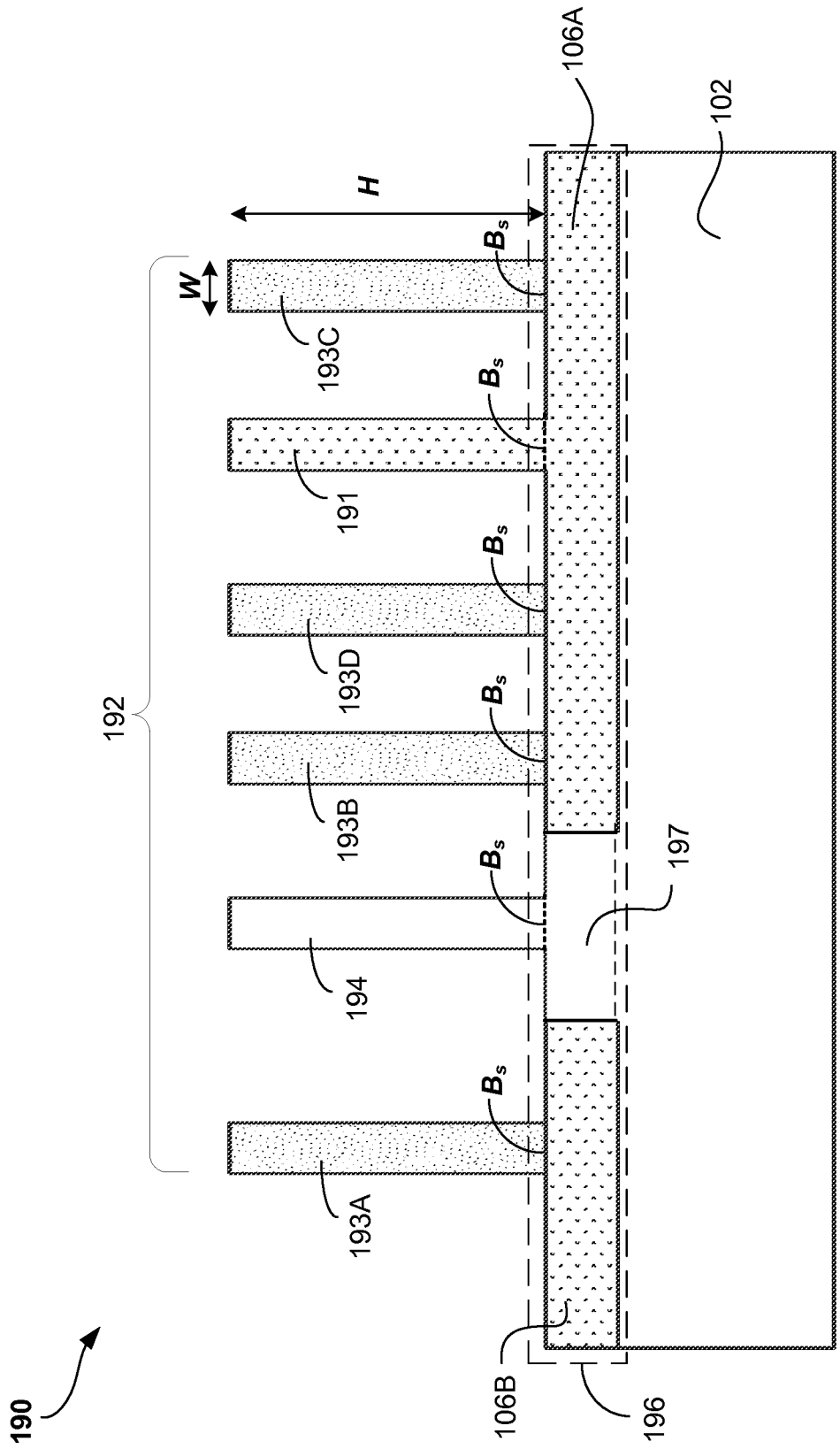
FIG. 1K illustrates a cross-sectional view of a structure formed by creating 3D fin structures from the structure of FIG. 1J, according to an exemplary embodiment.

Referring to FIG. 1K, semiconductor structure 190 may be created by forming fin structures 192 from the structure 185 of FIG. 1J. As depicted in FIG. 1K, each of the fins corresponding to fin structure 192 may have a height H in the range of about 30 nm-100 nm, although lesser or greater heights may be contemplated. Further, each of the fins corresponding to fin structure 192 may have a width W in the range of about 5 nm-30 nm, although lessor or greater widths may be contemplated. The fin structure 192 may be created using know fabrication techniques. For example, fin structure 192 may be formed from tensile strained silicon columns 186A-186C (FIG. 1J), compressive strained Ge (or SiGe) column 188 (FIG. 1J), and unstrained silicon column 187 (FIG. 1J) using, for example, a sidewall image transfer (SIT) fabrication process. Thus, lithographic patterning and reactive ion etching (RIE) techniques may be utilized.

Specifically, within fin structure 192, tensile strained silicon column 186C (FIG. 1J) may be used to form tensile strained silicon fin 193C, tensile strained silicon column 186B (FIG. 1J) may be used to form tensile strained silicon fins 193B and 193D, and tensile strained silicon column 186A (FIG. 1J) may be used to form tensile strained silicon fin 193A. Moreover, within fin structure 192, compressive strained Si or SiGe column 188 (FIG. 1J) may be used to form compressive strained Ge or SiGe fin 191, while unstrained silicon column 187 may accordingly be used to form unstrained silicon fin 194.

Figure 1L:
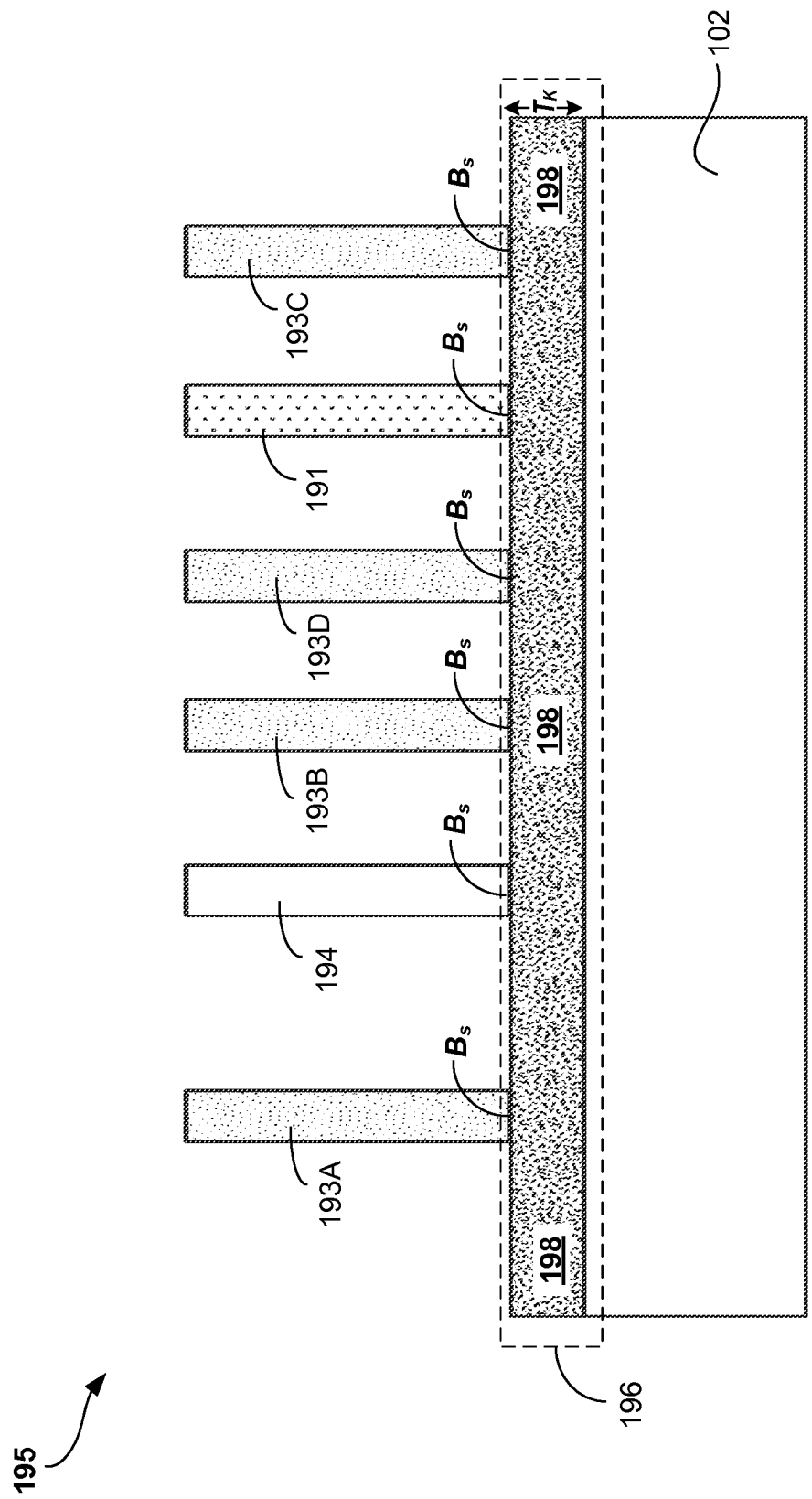
FIG. 1L illustrates a cross-sectional view of a structure formed by creating an insulating layer underlying the base of the 3D structures of FIG. 1K, according to an exemplary embodiment.

Referring to FIG. 1L, semiconductor structure 195 may be created by forming a layer of dielectric material (i.e., insulator layer) across the base region 196 (FIG. 1K) of the fin structure 192 depicted in FIG. 1K. As depicted in FIG. 1L, the base region 196 may be oxidized to form a layer of silicon dioxide 198 silicon oxide that extends directly from the base $B_s$ of each of the fins 193A-193D, 191, 194 into substrate 102 (i.e., within the top surface region of the substrate 102). The thickness $T_K$ of the layer of silicon oxide 198 may be in the region of about 10 nm-1 μm. The layer of silicon dioxide 198 silicon oxide may form an insulating layer that provides electrical isolation between each of the fins 193A-193D, 191, 194.

Alternatively, a layer of dielectric material (i.e., insulator layer) such as layer 198 may be formed across the base region 196 by physically removing layers 106A-106B (FIG. 1K) and layer 197 (FIG. 1K) from under the base $B_s$ (FIG. 1K) of each of the fins 193A-193D, 191, 194 (FIG. 1K). The removed layers 106A-106B, 197 (FIG. 1K) may subsequently be backfilled with a dielectric material (e.g., silicon oxide) to form layer 198. As depicted in FIG. 1L, each of the fabricated fins 193A-193D, 191, 194 (FIG. 1K) may be used to for complex circuits having different devices. For example, the strained fins 193A-193D, 191 may be used to form finFETs desiring high speed switching performance, while the unstrained fin 194 may be incorporated within the structure of a finFET used for analog circuitry.

Figure 2:
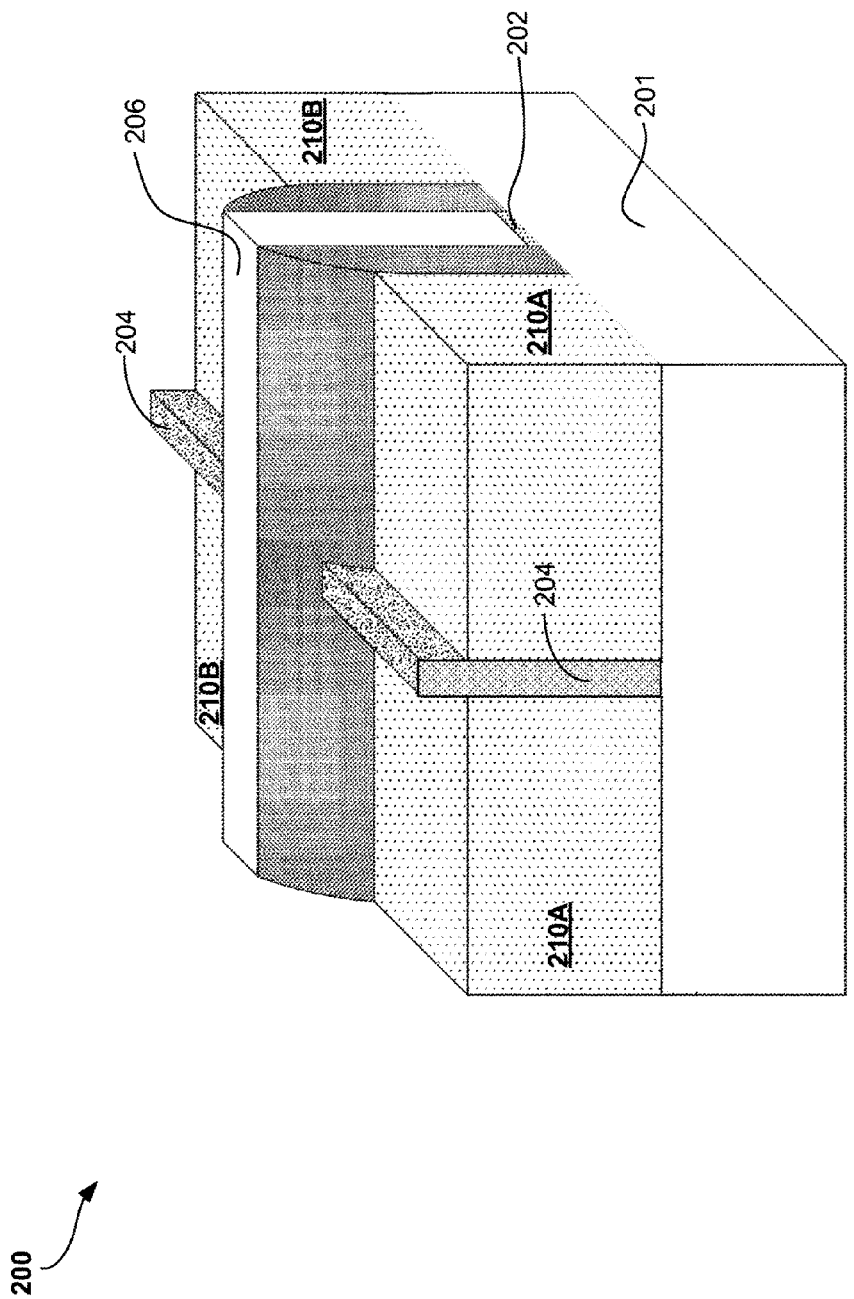
FIG. 2 illustrates an exemplary finFET structure employing the fins fabricated using the process depicted in FIGS. 1A-1L, according to an embodiment.

FIG. 2 illustrates a finFET device 200 that may incorporate one of the fabricated fin structures 193A-193D, 191, 194 described and illustrated herein. Referring to FIG. 2, finFET structure 200 may be created by having a fin 204 formed from one of fins 193A-193D, 191, or 194 of semiconductor structure 195 (FIG. 1L), according to one exemplary embodiment.

In particular, as shown in FIG. 2, finFET device 200 may include a high-k gate dielectric layer 202 that is deposited over substrate 201. The high-k dielectric layer 202 may include high-k materials such as, but not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, and lead scandium tantalum oxide. The high-k dielectric layer 202 may further include dopants such as lanthanum, aluminum.

Further referring to FIG. 2, gate electrode 206 may be formed over high-k dielectric layer 202 of finFET device 200. In some implementations, the formed gate electrode 206 may include materials such as, but not limited to, polysilicon or amorphous silicon, germanium, silicon germanium, a metal (e.g., tungsten, titanium, tantalum, ruthenium, zirconium, cobalt, copper, aluminum, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The thickness of the gate dielectric layer 202 may, for example, be in the range of about 1.0 nm-5.0 nm. Gate electrode 206 may have a thickness approximately in the range of about 20-100 nm and a length in the range of about 10-250 nm, although lesser and greater thicknesses and lengths may also be contemplated.

For a pFET device, source/drain regions 210A, 210B may include a silicon germanium (SiGe) type material, where the atomic concentration of germanium (Ge) may range from about 10-100%, preferably from about 20-60%. In a preferred exemplary embodiment, the concentration of germanium (Ge) may be 50%. SiGe may provide a compressive strain. Thus, the SiGe source/drain regions may exerts a longitudinal compressive strain in the direction of the channel region formed by the fin structure 204. Dopants such as boron may be incorporated into the SiGe source/drain regions by in-situ doping. The percentage of boron may range from 1E19 cm$^{-3}$ to 2E21 cm$^{-3}$, preferably 1E20 cm$^{-3}$ to 1E21 cm$^{-3}$. In a preferred exemplary embodiment, the percentage of boron may range from 4E20 cm$^{-3}$ to 7E20 cm$^{-3}$.

Alternatively, for an nFET finFET device, the source/drain regions 210A, 210B may include a carbon doped Silicon (Si:C) type material, where the atomic concentration of carbon (C) may range from about 0.4-3.0%, preferably from about 0.5-2.5%. In a preferred exemplary embodiment, the concentration of carbon (C) may be approximately 1.5-2.2%. Si:C provides a tensile strain. Thus, the Si:C source/drain regions may exert a tensile strain in the direction of the channel region formed by the fin 204. Dopants such as phosphorous or arsenic may be incorporated into the Si:C source/drain regions by in-situ doping. The percentage of phosphorous or arsenic may range from 1E19 cm$^{-3}$ to 2E21 cm$^{-3}$, preferably 1E20 cm$^3$ to 1E21 cm$^{-3}$. In a preferred exemplary embodiment, the percentage of boron may range from 4E20 cm$^3$ to 7E20 cm$^{-3}$.

In the above described embodiments, reference to a fin or a fin structure may be used interchangeably. Accordingly, fin structures may refer to multiple fins. Moreover, although a layer-by-layer transfer method is described to deposit strained layer 106 directly over unstrained layer 102, and deposit strained layer 108 directly over strained layer 106, other techniques may be employed. Such employed techniques may, among other things, preserve the strain of each strained layer.

Figure 3:
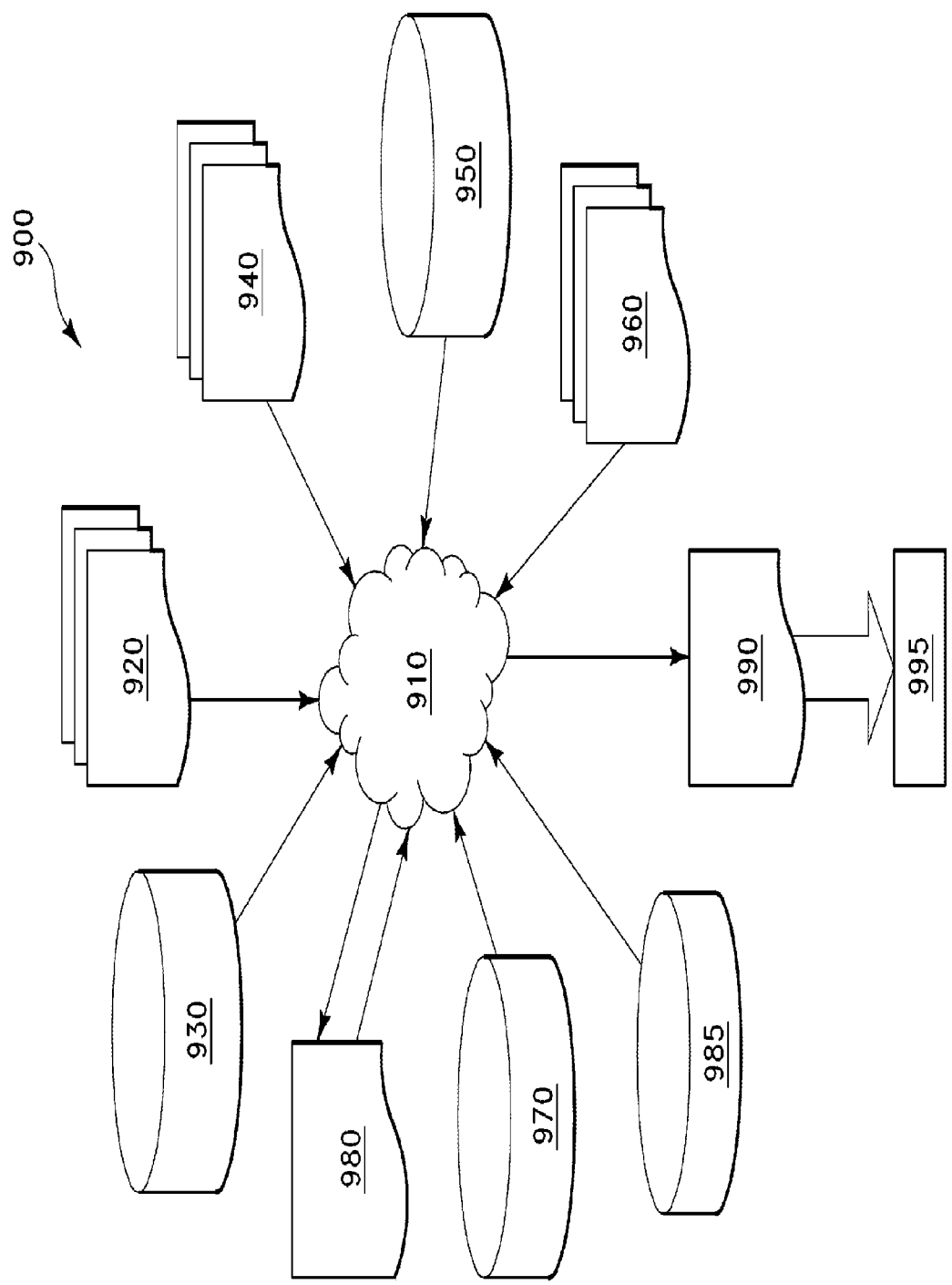
FIG. 3 is a flow diagram of a design process used in semiconductor design, manufacture, and/or test.

FIG. 3 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1L & 2. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. In one embodiment, the design structure 920 includes design data used in a design process and including information describing embodiments of the invention with respect to the structures as shown in FIGS. 1L & 2. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiments of the invention, as shown in FIGS. 1L & 2. Design structure 920 may be a logical simulation design structure generated and processed by design process 910 to produce a logically equivalent functional representation of a hardware device. Design structure 920 may also or alternatively include data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIGS. 1L & 2. As such, design structure 920 may include files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1L & 2 to generate a netlist 980 which may contain a design structure such as design structure 920. Netlist 980 may include, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 including second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably includes one or more files, data structures, or other computer-encoded data or instructions that reside on transmission or data storage media and that when processed by an ECAD system generate a logically or otherwise functionally equivalent form of one or more of the embodiments of the invention shown in FIGS. 1L & 2. In one or more embodiments, design structure 990 may include a compiled, executable HDL simulation model that functionally simulates the devices shown in FIGS. 1L & 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may include information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 1L & 2. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more described embodiment, the practical application or technical improvement over technologies found in the marketplace, or to enable other of ordinary skill in the art to understand the one or more embodiments disclosed herein.

What is claimed is:

1. A semiconductor structure comprising:
   an unstrained substrate layer;
   a dielectric layer located within a top surface region of the unstrained substrate layer;
   a first strained fin structure located on the dielectric layer, the first strained fin structure having a first strain characteristic;
   an unstrained fin structure located on the dielectric layer, the unstrained fin structure located adjacent to the first strained fin structure;
   a second strained fin structure located on the dielectric layer between the first strained fin structure and the unstrained fin structure, the second strained fin structure having a second strain characteristic;
   a third strained fin structure located on the dielectric layer adjacent to the first strained fin structure, the third strained fin structure having the second strain characteristic; and
   a fourth strained fin structure located on the dielectric layer adjacent to the at least one unstrained fin structure, the fourth fin structure having a second strain characteristic;
   wherein the first strained fin structure, the second strained fin structure, the third strained fin structure, the fourth strained fin structure, and the unstrained fin structure are formed from a multilayer lattice matched structure.

2. The structure of claim 1, wherein the first strain characteristic comprises a compressive strain, and wherein the second strain characteristic comprises a tensile strain.

3. The structure of claim 1, wherein the unstrained fin structure comprises an unstrained silicon material, the first strained fin structure comprises a germanium material, and the second, the third, and the fourth strained fin structure comprises a lattice stretched silicon material.

4. The structure of claim 1, wherein the first strained fin structure, the second strained fin structure, the fourth strained fin structure, and the unstrained fin structure are formed from a multilayer lattice matched structure.

5. The structure of claim 4, wherein the multilayer lattice matched structure comprises:
   an unstrained substrate layer;
   a first strained layer located directly on the unstrained substrate layer, the first strained layer having the first strain characteristic; and
   a second strained layer located directly on the first strained layer, the second strained layer having a second strain characteristic.

6. A method of forming a semiconductor structure comprising:
   forming a multilayer lattice matched structure having an unstrained layer, a first strained layer, and a second strained layer formed between the unstrained layer and the first strained layer;
   etching a first opening in the multilayer lattice matched structure and exposing a region of the second strained layer;
   depositing a second strained fill material having a same material as the second strained layer over the region of the second strained layer;
   forming more than one second strained fin structure from the deposited second strained fill material;
   etching a second opening in the multilayer lattice matched structure and exposing a region of the unstrained layer;
   depositing an unstrained fill material having a same material as the unstrained layer over the region of the unstrained layer;
   forming more than one unstrained fin structure from the deposited unstrained fill material;
   depositing a first strained fill material having a same material as the first strained layer between the unstrained fill material and the second strained fill material; and
   forming more than one first strained fin structure from the deposited first strained fill material,
   wherein the at least one first strained fin structure includes a tensile strain and the at least one second strained fin structure includes a compressive strain.

* * * * *